United States Patent [19]

Haman

[11] Patent Number: 4,504,779
[45] Date of Patent: Mar. 12, 1985

[54] ELECTRICAL LOAD DRIVE AND CONTROL SYSTEM

[75] Inventor: Daniel J. Haman, Boise, Id.

[73] Assignee: Hewlett-Packard Company, Palo Alto, Calif.

[21] Appl. No.: 474,388

[22] Filed: Mar. 11, 1983

[51] Int. Cl.³ ............................ G05F 1/56; H03K 17/00
[52] U.S. Cl. ....................................... 323/349; 307/255; 307/263; 307/270
[58] Field of Search ............... 323/349, 350, 351, 271; 307/255, 228, 246, 263, 270, 288, 577, 578

[56] References Cited

U.S. PATENT DOCUMENTS

| | | | |
|---|---|---|---|
| 3,444,394 | 5/1969 | Colvson | 307/263 X |
| 3,868,517 | 2/1975 | Schoeff | 307/263 X |
| 3,895,238 | 7/1975 | Saari | 307/255 |
| 4,320,521 | 3/1982 | Balakrishnan et al. | 307/270 X |
| 4,325,021 | 4/1982 | McMackin | 323/351 |

OTHER PUBLICATIONS

E. Hebenstreit, "Driving the SIPMOS Field-Effect Transistor as a Fast Power Switch", Siemens Forsch u. Entwickl-Ber, Bd. 9 (1980), No. 4, (c) Springer-Verlag 1980, pp. 200–204.

Primary Examiner—Peter S. Wong
Attorney, Agent, or Firm—Jeffrey B. Fromm; F. David LaRiviere; William H. MacAllister

[57] ABSTRACT

A circuit for varying the power supplied from a D.C. power supply to a moderate to high powered load such as a motor is disclosed. Trapezoidal voltage and current waveforms are used approaching the maximum load power delivery available from sine wave drives and the minimum dissipation in the driver circuitry available with square wave drives, while at the same time minimizing the generation of undesirable electromagnetic interference (EMI).

7 Claims, 7 Drawing Figures

ELECTRICAL LOAD DRIVE AND CONTROL SYSTEM

BACKGROUND

Many types of electrical loads such as motors require the regulation of the delivery of average power or frequency. Such loads are usually driven by either sine waves or pulse width modulated square waves which are generated from a D.C. supply voltage by means of a conventional bipolar transistor.

Theoretically, to obtain the most efficient use of such a load, a sine wave is utilized. However, excitation with a sine wave requires the transistor driver to operate as a linear device. Unfortunately, when operated in this fashion, the transistor must be capable of dissipating relatively large amounts of power.

An alternative to using sine waves, is the use of square waves. As far as the load is concerned this is slightly less efficient and involves an increase in output variations such as torque in a motor. However, square wave drives provide a significant increase in the efficiency of the driving circuit. This is because very little power is dissipated in the drive transistors when they are switched, very rapidly, either fully ON or full OFF in a binary digital manner. Unfortunately, the use of such a digital driver involves a serious drawback, which is due to the nature of square waves themselves; a square wave has leading and trailing edges with very fast rise and fall times. The result is a nearly instantaneous change in the flow of currents and voltages which leads to the generation of undesirable electromagnetic interference (EMI) as the power is delivered to the load.

SUMMARY OF THE INVENTION

The preferred embodiment of the present invention utilizes trapezoidal shaped voltage and current waveforms with leading and trailing edges of constant controlled slope to drive a load and thus provide high load power delivery, low drive power dissipation and low EMI generation. These requirements are especially important when controlling moderate to high powered loads such as motors in an EMI sensitive environment. The controlled slope drive permits the efficient trade off between driver dissipation and EMI generation by eliminating the fast ON and OFF times of square wave control. Further, at moderate to high drive speeds the efficiency of the power delivered to the load approaches that of a system driven by a sine wave.

The trapezoidal waveform drive is generated by controlling the voltage and current at the high impedance input of a MOS field effect transistor (MOSFET). The variable impedance output of the drive transistor is either ON or OFF for the majority of each waveform period providing low drive power dissipation, while at the same time the rate of change of load current $dI/dt$ and the rate of change of the load voltage $dV/dt$ are kept low enough so as not to produce unacceptable levels of EMI. Since the slope of the drive waveform is controlled at the input of the drive transistor, which is a relatively high impedance node as compared to the impedance of the load, small capacitors and constant current sources can be used to generate the desired controlled slope of the trapezoidal load waveform.

DETAILED DESCRIPTION OF THE INVENTION

Figure 1:
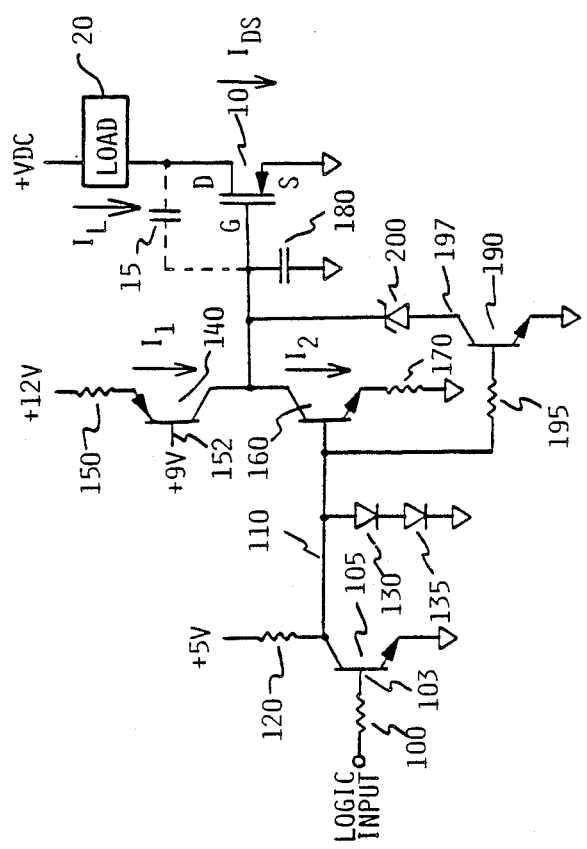
FIG. 1 shows a schematic of the preferred embodiment of the present invention.

FIG. 1 is a schematic of the preferred embodiment of the present invention and FIGS. 2A–2F show the related waveforms. In FIG. 1 an N-channel enhancement power MOSFET 10 is used to control the power delivered from a D.C. power supply +VDC to a load 20 by means of trapezoidal voltage and current waveforms so as to minimize both the dissipation of power in MOSFET 10 and the generation of EMI.

Figure 2A:
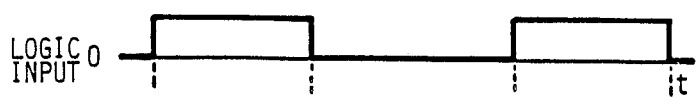
FIGS. 2A–2F show the waveforms associated with the schematic shown in FIG. 1.
Figure 2B:
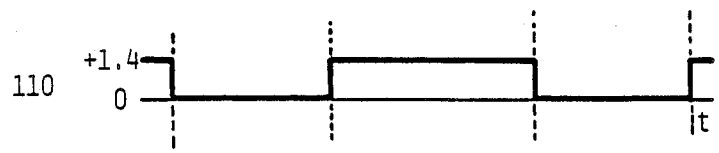

A conventional logic generated square wave as shown in FIG. 2A is applied from a logic input via resistor 100 to the base 103 of transistor 105. When transistor 105 is ON, voltage 110 will be near zero volts as shown in FIG. 2B. When transistor 105 turns OFF, voltage 110 will increase toward +5 V due to the current from resistor 120. However, diodes 130 and 135 will become forward biased and clamp the voltage 110 at +1.4 V.

Transistor 140 along with resistor 150 coupled to a +12 V power supply serve as a constant current source $I_1$ since the base voltage 152 of transistor 140 is held constant. Because of the voltage drop of the base to emitter junction of transistor 140, the current $I_1$ will be:

$$I_1 = (12-9-0.7) \text{ volts}/383 \text{ ohms} = 6 \text{ mA}$$

when the base voltage 152 is +9 V, the positive supply is +12 V and resistor 150 is 383 ohms. In similar fashion, transistor 160 along with resistor 170 serves as a switchable constant current sink $I_2 = 12$ mA when voltage 110 is clamped at +1.4 V and resistor 170 is 56 ohms. When voltage 110 is zero volts, transistor 160 turns OFF and $I_2 = 0$.

Figure 2C:
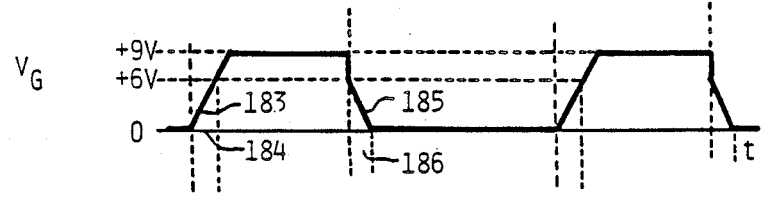

Constant current source $I_1$ and switchable current sink $I_2$ are both connected to a capacitior 180 and to the gate G of MOSFET 10. As shown in FIG. 2C, when current sink $I_2$ is turned OFF the voltage $V_G$ on the gate G will increase in substantially linear fashion at a slope $dV/dt = I/C$ where $I = I_1$ and C is the capacitor 180 until transistor 140 saturates at +9 V. Thus if $I_1 = 6$ mA and capacitor 180 is 0.015 microfarads, the slope 183 of VG will increase during the period 184 as shown approximately in FIG. 2C. Since in the example shown $I_2$ is selected to be twice $I_1$, when current sink $I_2$ is turned ON the decreasing slope 185 of $V_G$ during period 186 is the same magnitude as the increasing slope 183 and with approximately the same shape. Note that $I_2$ need only be slightly greater than $I_1$ in order to discharge capacitor 180.

Another transistor 190 is also coupled to voltage 110 via resistor 195. The collector 197 of transistor 190 is connected via a reference ("Zener") diode 200 to the gate G of MOSFET 10. The reference voltage of diode 200 is chosen to be slightly greater than the gate pinch off voltage of MOSFET 10, typically 6 V. When transistor 160 is ON, (i.e. $I_2 = 12$ mA), transistor 190 is ON, and when transistor 160 is OFF (i.e. $I_2 = 0$), transistor 190 is OFF. Thus as shown in FIG. 2C, when voltage 110 goes high, the gate voltage $V_G$ will quickly fall from +9 V (i.e. the saturation voltage of transistor 140) to +6 volts (i.e. the reference voltage of diode 200), then decline in substantially linear fashion at the slope 185. Since the MOSFET 10 acts as a variable resistance between its drain D and source S terminals when $V_G$ is less than the pinch off voltage, the drain to source voltage $V_{DS}$ will vary as shown in FIG. 2D, with sides 210 and 215 sloping in substantially linear fashion during periods 184 and 186 respectively as will be more fully explained shortly.

Thus when transistor 160 is fully on, the voltage $V_G$ at the gate G of MOSFET 10 is equal to the saturation voltage of transistor 160 plus the voltage drop across resistor 170. Since this voltage (approximately one volt) is less than its threshold level, MOSFET 10 remains off. When the input logic goes to a high state, both transistors 160 and 190 turn off and the current $I_1$ begins to charge capacitor 180. Voltage $V_G$ then begins to linearly increase with slope 183. When $V_G$ reaches the threshold voltage of MOSFET 10, the drain to source current $I_{DS}$ begins to increase as shown in FIG. 2F. The rate at which $I_{DS}$ increases (slope 230 in FIG. 2F) is directly related to the slope 183 of $V_G$. The slope 183 may be independently varied by choosing an appropriate value for capacitor 180 after the current $I_1$ has been established.

Figure 2D:
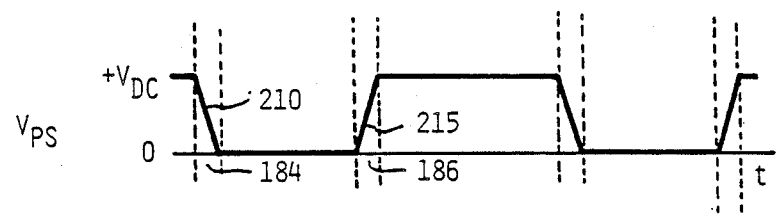

Some time after $V_G$ reaches the threshold voltage of MOSFET 10, the voltage $V_{DS}$ across MOSFET 10 begins to decline at slope 210 shown in FIG. 2D. The rate at which $V_{DS}$ falls is determined by the so-called "Miller" effect. As $V_{DS}$ falls, the decreasing voltage at the drain D causes the MOSFET's internal parasitic capacitor 15 to bleed a discharging current from the gate G. This tends to reduce the rate of rise of voltage $V_G$ which had previously been controlled only by capacitor 180 and current $I_1$. An equalibrium state is then reached in which $V_{DS}$ declines at just that rate which maintains the gate voltage $V_G$ at a level which allows current $I_{DS}$ to continue flowing.

The length of time required for $V_{DS}$ to fully decline is determined by capacitor 15 and current $I_1$. Since capacitor 15 is an internal parasitic capacitor whose value is defined, then the rate of decline is externally controlled exclusively by current $I_1$. Naturally, an external capacitor can be used if desired in parallel with capacitor 15. In either case, the smaller the value of $I_1$, the longer will be the time required in charging capacitor 15 which results in a lessening of slope 210; and visa versa. Therefore, the slope 210 can be independently controlled by choosing an appropriate value for $I_1$. $I_1$ can be varied by selecting resistor 150 as explained previously according to the following formula:

$$R_{150} = (12-9-0.7) \text{ volts}/I_1$$

Very similar actions take place during the time interval when MOSFET 10 turns off. The logic input goes to a low level causing both transistors 160 and 190 to turn on. Transistor 190 in conjunction with zener diode 200 quickly discharge capacitor 180 which forces voltage $V_G$ to a level slightly greater than the gate pinch off voltage of MOSFET 10 (approximately +6 volts). The gate voltage $V_G$ then begins to linearly decline at rate 185. The slope 185 is determined by capacitor 180 and the difference between currents $I_2$ and $I_1$ as will be fully discussed later. When MOSFET 10 enters the pinch-off region, $V_{DS}$ begins to increase. The rate 215 at which $V_{DS}$ increases is once again determined by the Miller effect. Therefore, the time required for $V_{DS}$ to completely rise during turn-off is determined by parasitic capacitor 15 and the difference current $I_2-I_1$. Since capacitor 15 is intrinsically defined and current $I_1$ has previously been determined, then the slope 215 may be independently varied by controlling $I_2$. Current $I_2$ may be changed by selecting resistor 170 according to the following formula:

$$R_{170} = (1.4-0.7) \text{ volts}/I_2$$

Once again, the smaller the value of the available current $I_2-I_1$ which charges capacitor 15, the lower becomes slope 215. In any case $I_2$ must always be larger than $I_1$ in order for MOSFET 10 to be able to turn off.

Some time after MOSFET 10 initially reaches pinch-off, the current $I_{DS}$ begins to decrease. The rate 235 at which $I_{DS}$ declines is directly related to the slope 185 of $V_G$. As previously mentioned, slope 185 is now determined by capacitor 180 and the difference current $I_2-I_1$. Values for currents $I_1$ and $I_2$ are chosen to vary the rise and fall slopes 215 and 210 respectively of $V_{DS}$. Capacitor 180 is chosen to vary the rise time of $I_{DS}$ (slope 230 in FIG. 2F). One or more of these values may also be changed somewhat to vary the slope of $I_{DS}$ during turn-off (slope 235 in FIG. 2F).

The current $I_{DS}$ stops flowing through MOSFET 10 when the gate voltage $V_G$ drops below MOSFET 10's threshold voltage. The gate voltage $V_G$ continues to decline at slope 185 until it reaches its minimum value of approximately one volt as explained previously.

Figure 2E:
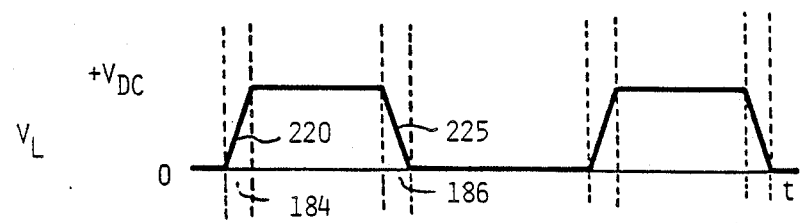
Figure 2F:
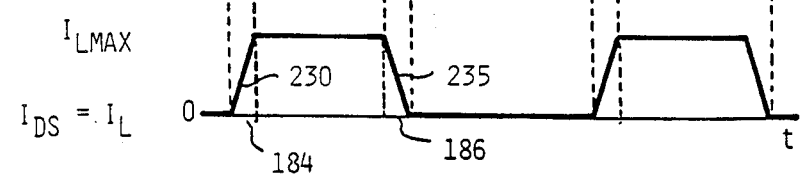

Thus the voltage $V_L$ across the load 20 as shown in FIG. 2E and the current $I_L$ through the load 20 as shown in FIG. 2F will have the shape of a trapezoid with substantially linear sloping sides 220, 225, 230 and 235. By controlling the three independently variable parameters, $I_1$, $I_2$ and capacitor 180, it is possible to independently optimize these rise and fall times as MOSFET 10 switches power through load 20. This permits both the reduction of generated EMI and also the selection of power dissipation levels in MOSFET 10 which are within its safe operating specifications. In general, as the slopes of sides 220, 225, 230 and 235 are increased, there will be less power dissipated in MOSFET 10, but increased levels of EMI will be generated. As the slopes of sides 220, 225, 230 and 235 are decreased, more power will be dissipated in MOSFET 10, with less EMI.

What is claimed is:

1. Apparatus for supplying power from a DC power supply to a load in response to an external control signal, said apparatus comprising:
   an internal control signal generator for producing internal control signals having independently selectable rising and falling slopes; and
   switch means having an input terminal coupled to the internal control signal generator and output terminals for coupling said DC power to said load at a rate of change controlled by said slopes of the internal control signals;
   said internal control signal generator including a capacitor connected to the input terminal of the switch means, a controllable current source, coupled to the capacitor, for charging the capacitor to turn on the switch means at a substantially linear rising rate in response to the external control signal; and a controllable current sink for discharging the capacitor to turn off the switch means at a substantially linear falling rate in response to the external control signal.

2. Apparatus as in claim 1 wherein the switch means is a variable impedance in series with the load.

3. Apparatus as in claim 1 wherein the controllable current source comprises a transistor having a base, emitter and collector for conducting current at a controlled rate through its emitter and collector and a resistance from a DC voltage to the input terminal of the switch means in response to selectable bias at the base.

4. Apparatus as in claim 1 wherein the controllable current sink comprises a transistor having a base, emitter and collector for simultaneously conducting current from the controllable current source and discharge current from the capacitor at a controlled rate through the emitter and collector of the second transistor in response to the external control signal applied to the base of said transistor.

5. Apparatus as in claim 1 wherein the rising and falling slopes of the internal control signal are selected for minimum EMI generation and power dissipation by the switch means.

6. A method for supplying power from a DC power source to a load in response to an external control signal in a circuit having switch means coupled to an internal control signal generator, said method comprising the steps of:

producing an internal control signal having independently selectable rising and falling slopes by charging a capacitor coupled to the switch means at a substantially linear rising rate from a controllable current source and discharging the capacitor at a substantially linear falling rate into a controllable current sink in response to the external control signal;

coupling DC power to the load at a rate of change controlled by said slopes of the internal control signal.

7. The method as in claim 6 further comprising the step of selecting the rising and falling slopes of the internal control signal for minimum EMI generation and power dissipation by the switch means.

* * * * *